(12) United States Patent
Whitehead

(10) Patent No.: US 7,822,301 B2
(45) Date of Patent: Oct. 26, 2010

(54) SIMPLE FIDUCIAL MARKING FOR QUALITY VERIFICATION OF HIGH DENSITY CIRCUIT BOARD CONNECTORS

(75) Inventor: Thomas Whitehead, Chicago, IL (US)

(73) Assignee: Emcore Corporation, Albuquerque, NM (US)

( * ) Notice: Subject to any disclaimer, the term of this patent is extended or adjusted under 35 U.S.C. 154(b) by 0 days.

(21) Appl. No.: 12/367,366

(22) Filed: Feb. 6, 2009

(65) Prior Publication Data

US 2009/0141270 A1    Jun. 4, 2009

Related U.S. Application Data

(62) Division of application No. 11/240,400, filed on Sep. 30, 2005.

(51) Int. Cl.
G02B 6/12 (2006.01)
G06K 9/00 (2006.01)

(52) U.S. Cl. .................. 385/14; 385/147; 382/147; 382/151

(58) Field of Classification Search .................. 385/14, 385/147; 382/147, 151
See application file for complete search history.

(56) References Cited

U.S. PATENT DOCUMENTS

| | | | |
|---|---|---|---|
| 5,627,931 A | 5/1997 | Ackley et al. | |
| 6,239,590 B1 | 5/2001 | Krivy et al. | |
| 6,602,734 B1 | 8/2003 | Wada et al. | |
| 6,635,866 B2 | 10/2003 | Chan et al. | |
| 6,656,646 B2 | 12/2003 | Hotta et al. | |
| 6,815,128 B2 | 11/2004 | Rumsey et al. | |
| 6,937,004 B2 * | 8/2005 | Ohazama .................. | 324/158.1 |
| 6,938,335 B2 * | 9/2005 | Kuribayashi et al. .......... | 29/834 |
| 7,220,975 B2 | 5/2007 | Koike et al. | |
| 7,353,599 B2 | 4/2008 | Lau et al. | |
| 7,614,800 B2 | 11/2009 | Lau et al. | |
| 2005/0282360 A1 | 12/2005 | Kida et al. | |

* cited by examiner

*Primary Examiner*—Jerry T Rahll

(57) ABSTRACT

A printed circuit board with a printed pattern of fiducial marks on a first side of the printed circuit board including a first indicia including a right triangle with its base parallel to a first edge of the board and an alignment mark adjacent thereto, and a second indicia including a right triangle with its base parallel to a second edge of the board opposite said first edge, and an alignment mark adjacent thereto.

16 Claims, 6 Drawing Sheets

SIMPLE FIDUCIAL MARKING FOR QUALITY VERIFICATION OF HIGH DENSITY CIRCUIT BOARD CONNECTORS

REFERENCE TO RELATED APPLICATIONS

This application is a divisional application of copending U.S. application. Ser. No. 11/240,400 filed Sep. 30, 2005, and herein incorporated by reference in its entirety.

This application is related to copending U.S. application Ser. No. 11/240,402, of Lau et al., filed Sep. 30, 2005.

This application is related to U.S. Pat. No. 7,353,599 of Lau et al., filed May 1, 2007.

BACKGROUND OF THE INVENTION

1. Field of the Invention

The invention relates to electro-optic conversion modules, and particularly to the use of fiducial markings on such printed boards in such modules for verification of printing alignment, fabrication accuracy, and quality control of printed electrical connectors fabricated on such boards.

2. Description of the Related Art

Optical data transmission networks provide high capacity signal transmission without many of the physical limitations of electrical cables. Fiber-optic transceivers used in such networks convert electrical signals into optical signals and vice versa at the interface of a fiber-optic cable and an electronic network unit, such as a computer or communications system.

To extend the application of the fiber optic transceiver for mass-produced, low-cost computer and communications devices, it is desirable for the individual components to be economical to fabricate, and thus the electrical connect to be simple and reliable at the same time. The typical hardware design of these low-cost transceivers provides the use of a printed circuit board that terminate on one side with a cut out pin edge or a contact array forming a multi-pin electrical connector, which may be implemented on one or both sides of the board. With such a contact array, the circuit board can be directly plugged into a mating electrical receptacle on the back end of the chassis of a host computer. The cut out connector may also be elongated, and sized to be able to extend through an open slot in the back face of the computer chassis so that connection may be made to a receptacle mounted inside the chassis on a mother board of the computer.

A number of industry standards have been defined to integrate some of these electrical connector design considerations into opto-electronic transceiver modules. For example, the XENPAK standard (see www.xenpak.org) describes an advantageous opto-electronic transceiver module package with a cut out printed circuit board electrical connector.

Like any lithographically printed circuit board, mask alignment and routing introduce variations from board to board that present issues of reliability and quality control, especially for high density pin configuration.

Prior to the present invention, there has not been a reliable process to ensure quality control in parallel optical module with a cut-out printed pin array electrical connector. Thus, it is desired to have a fiducial mark associated with the board design for the pin out or electrical contact array for making the electrical connection from the board which can be quickly and easily visually checked by quality assurance personnel in a production environment to determine if the routed board meets specification.

SUMMARY OF THE INVENTION

Briefly and in general terms, the present invention provides printed circuit board having a printed pattern of fiducial marks on a first side of the printed circuit board including a first indicia including a right triangle with its base parallel to a first edge of the board and an alignment mark adjacent thereto, and a second indicia including a right triangle with its base parallel to a second edge of the board opposite said first edge, and an alignment mark adjacent thereto.

In another aspect, the invention further provides planar printed circuit board having a first edge, a second edge opposite the first edge, and a third edge extending between the first and second edge; and a printed circuit pattern imprinted on a first side of the circuit board using a mask pattern including a plurality of connector contact areas extending along the third edge and a first indicia including a right triangle with its longer side parallel to a first edge of the printed circuit board.

In a further aspect, the present invention provides an optical transceiver for converting and coupling an information-containing electrical signal with an optical fiber having a housing including a fiber optic connector adapted for coupling with an external optical fiber for transmitting and/or receiving an optical communications signal; a rigid printed circuit board in the housing including a first edge forming a connector for coupling with an external electrical cable or information system device and for transmitting and/or receiving an information-containing electrical communications signal; and a pattern of triangular shaped fiducial marks on second and third opposed edges of said circuit board for assuring the accuracy and alignment of the electrical contacts of said connector.

In another aspect, the invention provides a method of qualifying the accuracy of a printed and cut printed circuit board by providing a printing mask pattern for a first side of the printed circuit board with a first sequence of a spaced indicia adjacent to a first edge of the board; and a second sequence of spaced indicia adjacent to a second edge of the board opposite said first edge; printing a layer of visually conspicuous material on a printed circuit board using said mask pattern; determining position of the acute angle vertex of the triangle with respect to the alignment mark and based upon such determination accepting or rejecting the board.

In still another aspect, the invention provides a method of increasing the accuracy of a quality control screening procedure by providing an alignment guide that magnifies the measurement of a potential error by a factor depending upon the angle of the apex of the triangle fiducial mark. The measured distance is effectively mirrored and amplified across the hypotenuse of the right triangle. The degree of magnification is controlled by the acute angle of the triangle fiducial. This feature increases the accuracy of the measurement of a routing error and enables visual inspection of the production boards.

Some implementations may incorporate or implement fewer of the aspects or features noted in the foregoing summaries.

The novel features and characteristics of the invention are set forth in the appended claims. The invention itself, however, as well as other features and advantages thereof, will be best understood by reference to a detailed description of a specific embodiment, when read in conjunction with the accompanying drawings.

BRIEF DESCRIPTION OF THE DRAWINGS

FIG. 3b is an enlarged view of the left fiducial markings of the board of FIG. 3a;

DESCRIPTION OF THE PREFERRED EMBODIMENT

Figure 1:
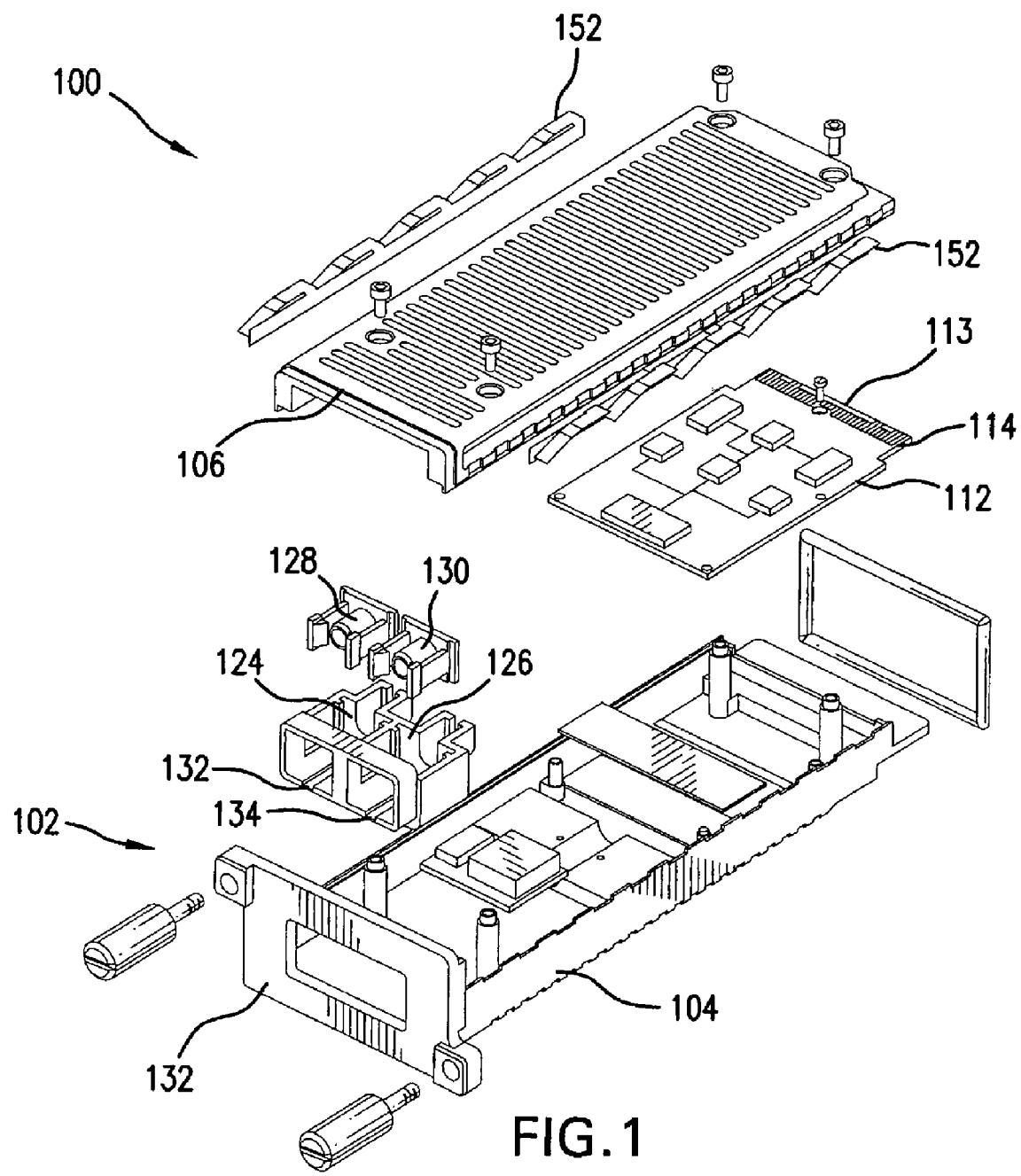
FIG. 1 is an exploded perspective view of an optical transceiver incorporating the cut out printed circuit board according to the present invention.

Details of the present invention will now be described, including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of actual embodiments or the relative dimensions of the depicted elements, and are not drawn to scale.

FIG. 1 is an exploded perspective view of an optical transceiver 100 incorporating the cut out printed circuit board with fiducial marks according to the present invention. In this particular embodiment, the transceiver 100 is compliant with the IEEE 802.3ae 10 GBASE-LX4 Physical Media Dependent sub-layer (PMD) and the XENPAK.TM. form factor. It is to be noted, however, that the transceiver 100 may be configured to operate under various other compliant protocols (such a Fibre Channel or SONET) and be manufactured in various alternate form factors such as X2. The transceiver 100 is preferably a 10 Gigabit Coarse Wavelength Division Multiplexed (CWDM) transceiver having four 3.125 Gbps distributed feedback lasers and provides 300 meter transmission over legacy installed multimode fiber and from 10 to 40 km over standard single mode fiber.

The transceiver 100 includes a two-piece housing 102 with a base 104 and a cover 106. In addition, contact strips 152 are provided to ground the module to chassis ground as well. The housing 102 is constructed of die-cast or milled metal, preferably die-cast zinc, although other materials also may be used, such a specialty plastics and the like. Preferably, the particular material used in the housing construction assists in reducing EMI. Further, EMI reduction may be achieved by using castellations (not shown) formed along the edges of the housing 102.

The front end of the transceiver 100 includes a faceplate 132 for securing a pair of receptacles 124, 126. The receptacles 124, 126 are configured to receive fiber optic connector plugs 128, 130. In the preferred embodiment, the connector receptacle 128, 130 are configured to receive an optical fiber with industry standard SC duplex connectors (not shown). As such, keying channels 132 and 134 are provided to ensure that the SC connectors are inserted in their correct orientation. Further, as shown in the exemplary embodiment and discussed further herein, the connector receptacle 126 receives an SC transmitting connector and the connector plug 124 receives an SC receiver connector.

In particular, the transceiver housing holds one or more circuit boards, including a transmit receive and a physical coding sub-layer subassemblies, and interface board 112, which is used to provide an electrical interface to external electrical systems (not shown).

The rear edge 113 of the board 112 includes a printed pattern of contact points 114 which form individual electrical connections to an external mating receptacle on the external system which the transceiver is associate with. The size and number of pins depends upon the particular standard. In the preferred embodiment, the 70 pin board edge connector is as set forth in the XENPAK and X2 Multi-Source Agreements.

Figure 2:
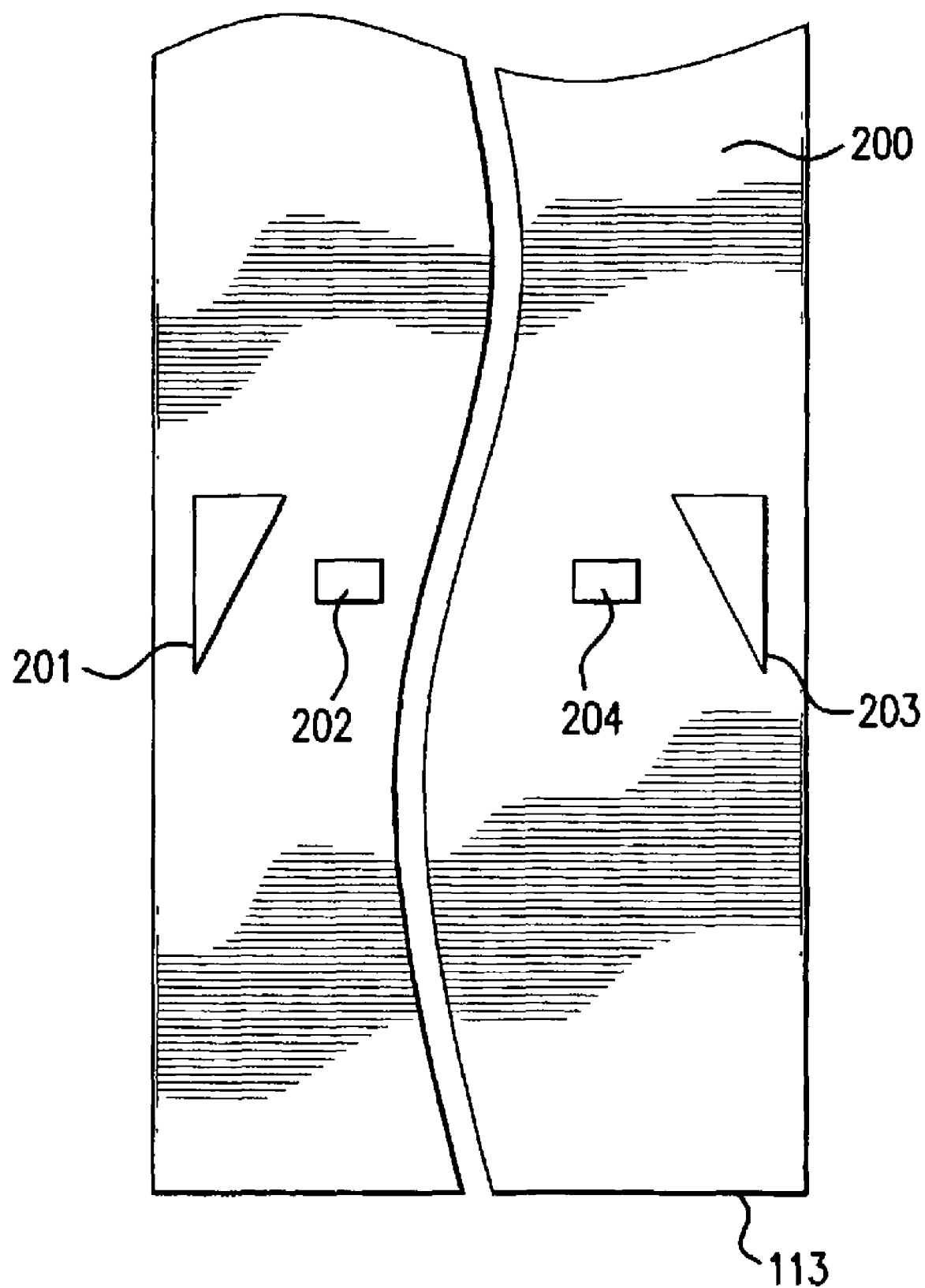
FIG. 2 is the mark pattern of fiducial indicia used for printing a printed circuit board according to the present invention.

FIG. 2 is the mark pattern of fiducial indicia 201 and 202, and 203 and 204 used in a mask for printing a single printed circuit board according to the present invention. In an actual production process, a number of identical printed circuit boards will be laid out in an array on a panel and printed simultaneously. After the single panel is printed, the individual boards are then separated or cut out with a router or other process equipment.

Figure 3A:
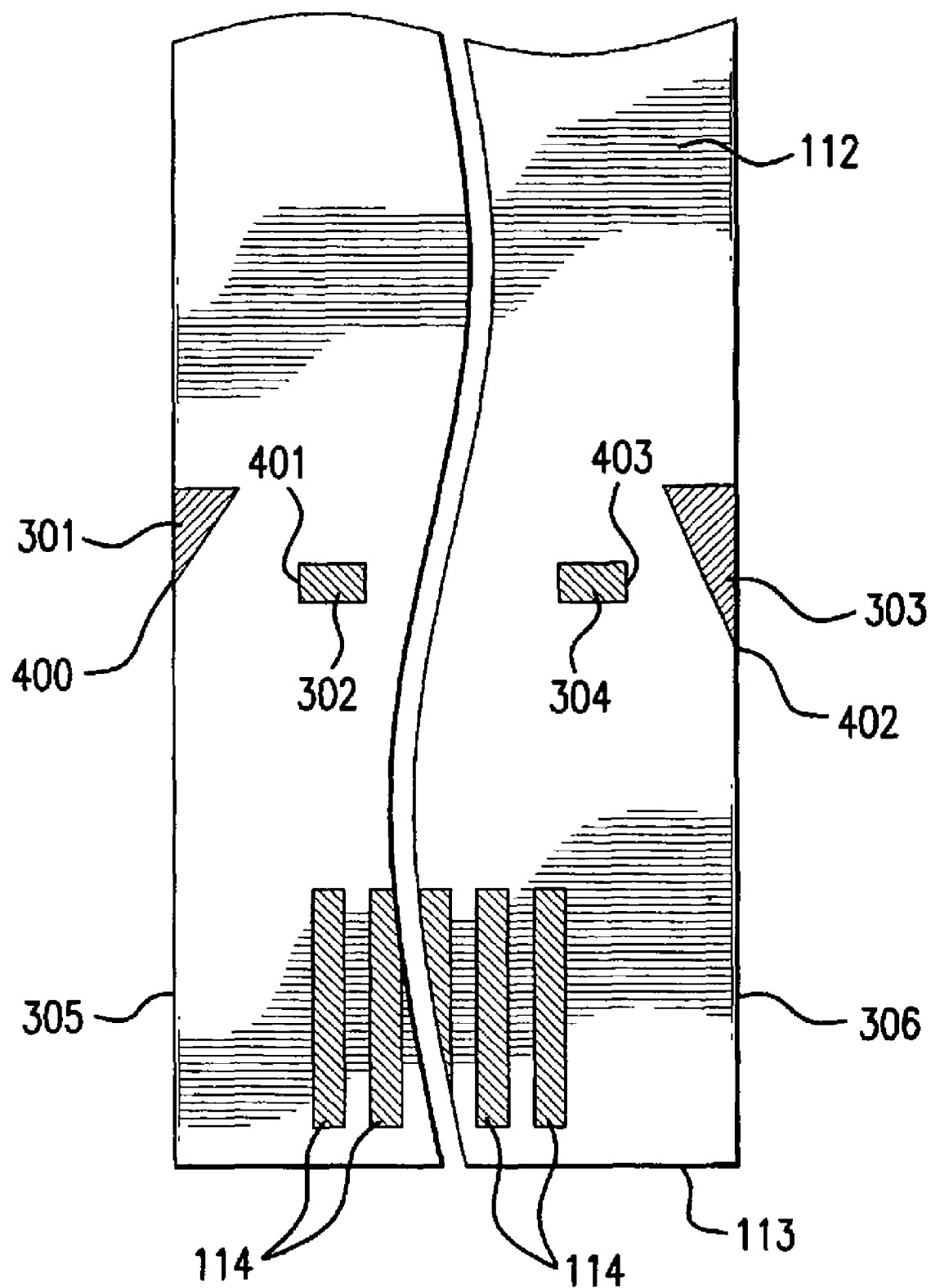
FIG. 3a depicts a production printed circuit board with a pattern of fiducial indicia present after routing.

FIG. 3(a) depicts the result of an overlay of the mark pattern of FIG. 2 over a printed circuit board 200 which is printed with metallization, including the contact points 114, and routed. The result of the routing creates a different sizing of the original fiducial marks.

In particular, the figure depicts the top view of a specimen production printed circuit after routing illustrating a resulting fiducial mark pattern that may be used by the technique of the present invention for quality control inspection. Because of the position of the left hand edge 305 at the board, as determined by the router, the left side right triangle 301 has been approximately cut in half, with the vertex 400 now located at substantially the same distance from the rear edge 113 as the left hand side 401 of the fiducial mark 302.

On the other edge 306 of the board 112, the right triangle 303 has been barely cut or diminished by the router. The vertex 402 of triangle 303 lies well below the right hand side 403 of the fiducial mark 304, as is apparent from visual inspection.

Figure 3B:
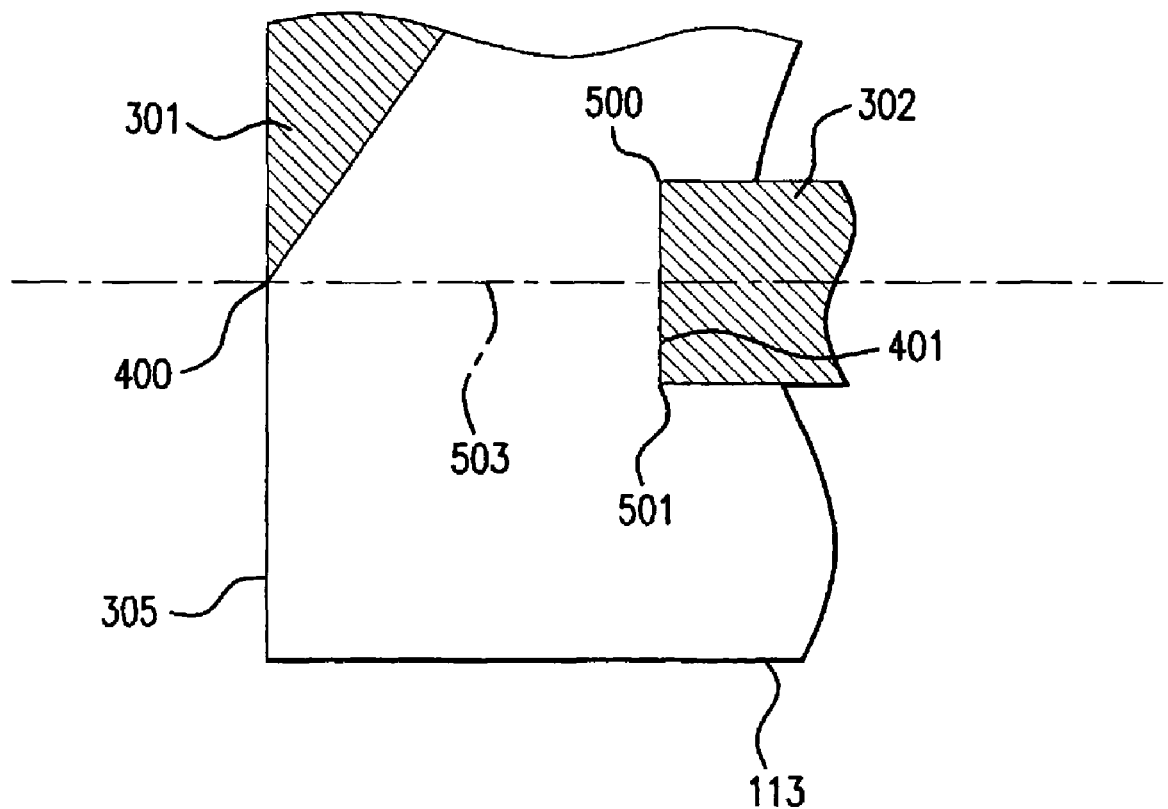

The present invention utilizes the position of the vertex of the right triangle with respect to the alignment edge 401 or 403 of the alignment mark to determine whether the board is acceptable. FIG. 3(b) is an enlarged view of the left side of the printed circuit board illustrated in FIG. 3(a) to more accurately describe the acceptability criteria. The quality control operator notes the position of the vertex 400 of the triangular fiducial mark 301 as determined by the cut 305 that forms the left hand peripheral edge of the board. One then considers an imaginary line 503 parallel with the rear edge 113 originating at the vertex 400 and extending into the adjacent rectangular-shaped alignment fiducial mark 302. If the line 503 intersect the mark 302, i.e. the line lies between the upper corner edge 500 and the lower corner edge 501 of the left hand peripheral side of the mark 302, then the routing cut 305 is within specification.

Of course, fiducial marks other than right triangles and rectangular-shaped alignment fiducial marks may be used as well, and are within the scope of the present invention.

Figure 4:
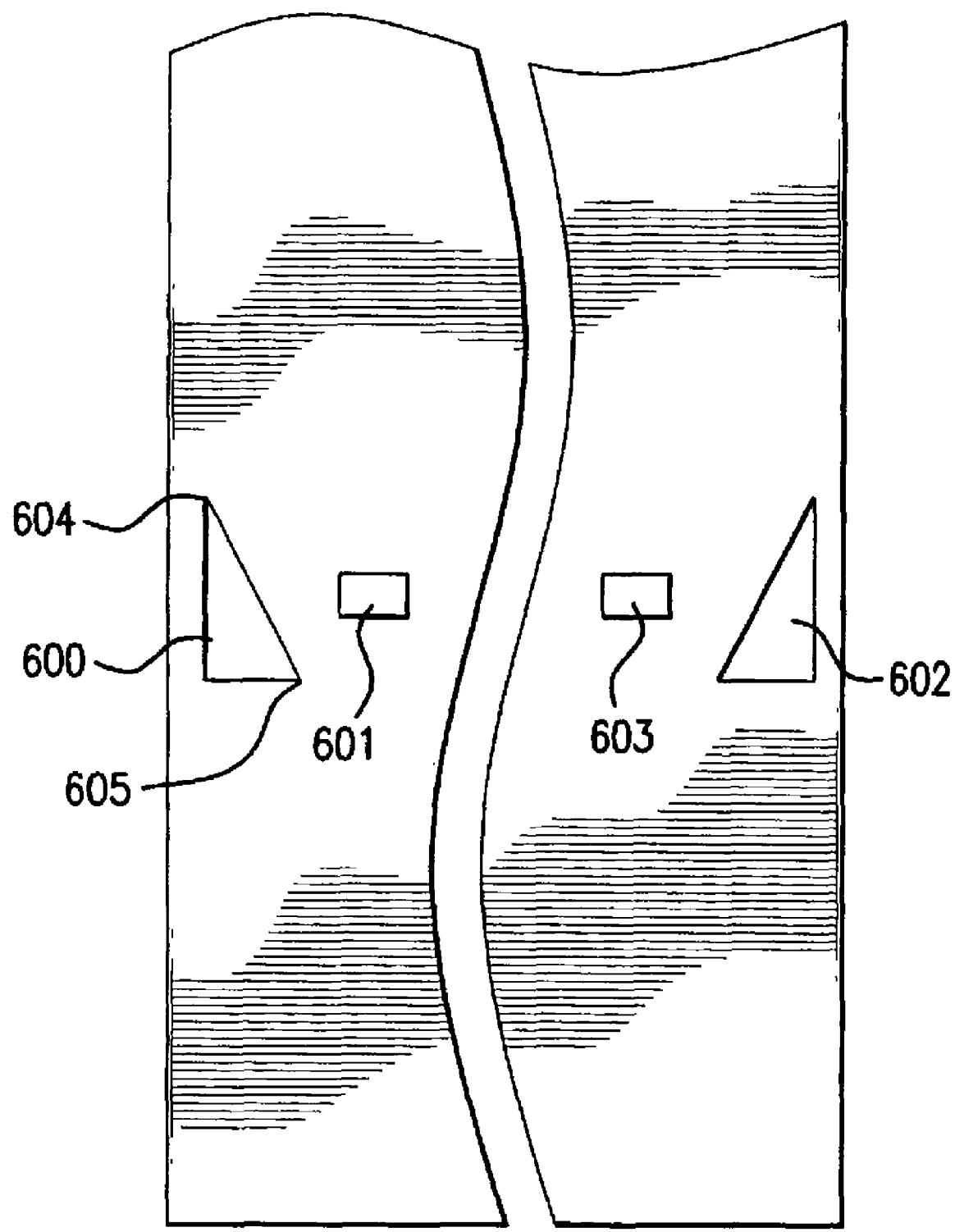
FIG. 4 is an alternative mark pattern of fiducial indicia according to the present invention.

FIG. 4 is an alternative fiducial mark pattern according to the present invention. The alignment marks 601 and 603 are identical as 302 and 304 in FIG. 3(a). The right triangles 600 and 602 are similar in size as 301 and 303 in FIG. 3(a), but are oriented differently. Instead of the lower vertex 400 being used as in FIG. 3(a), the embodiment of FIG. 4 utilizes the upper vertex 604, as the point to be compared with the adjacent peripheral edge of the alignment mark 601.

Figure 5:
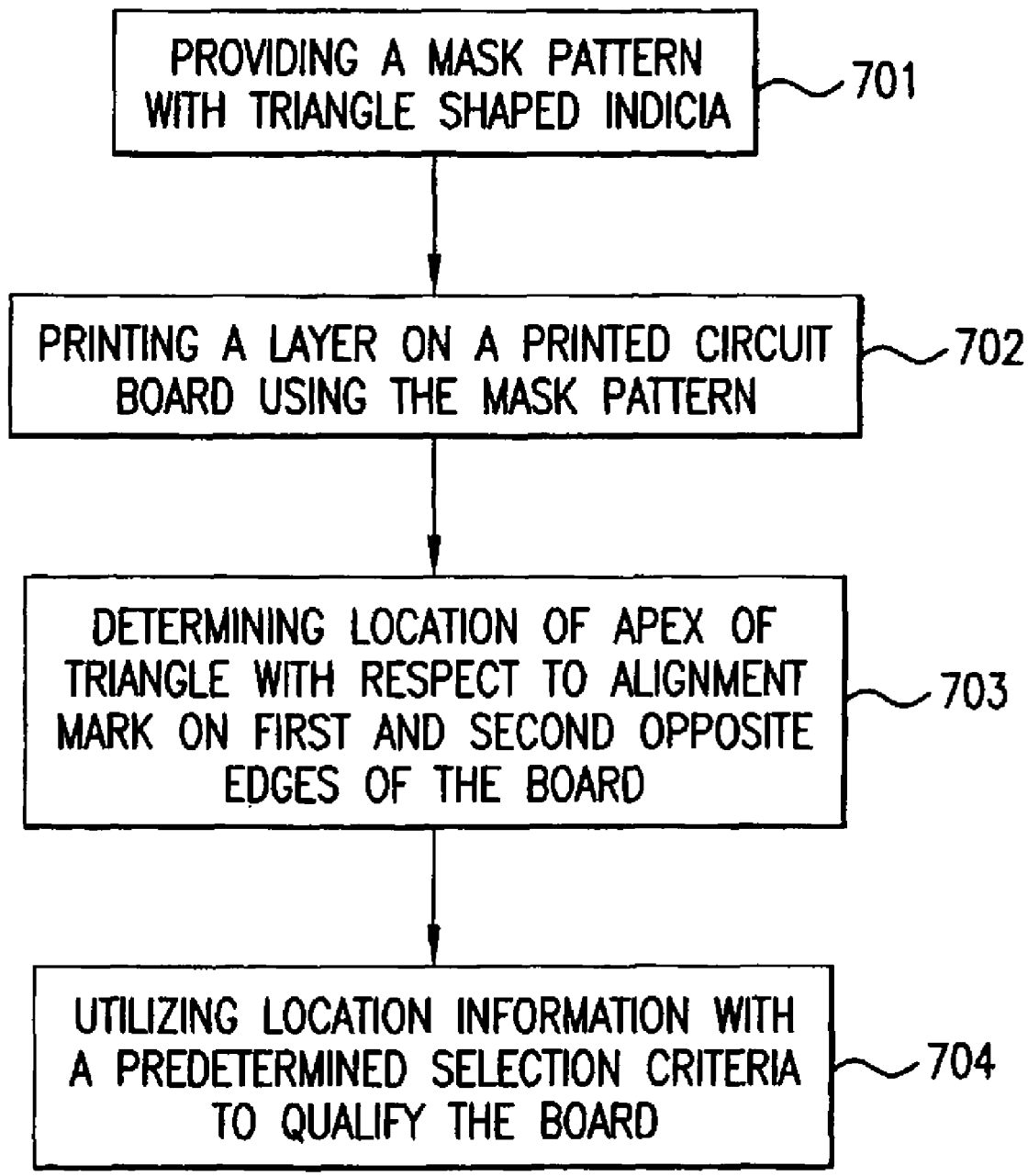
FIG. 5 is a flow chart depicting the method of using the fiducial marks according to the present invention in a quality control protocol.

FIG. 5 is a flow chart depicting the method of using the fiducial marks according to the present invention in a quality control protocol. In the highly simplified method illustrated in the flow chart, the first step 701 is to provide a mask pattern with fiducial marks including a right triangle shaped indicia, and a corresponding alignment mark, associated with the edge where the pin contacts are to be printed.

In the next step 702, a layer is printed on the printed circuit board (or on the panel of several boards) including the fiducial marks. Typically, the fiducial marks may be the same metal layer as the pin contacts, so only a single print step is involved for each side of the board. Following printing, the individual boards may be separated or routed from the panel.

The next step 703 is to determine the location of the apex of the indicia with respect to an alignment mark on the first and second opposite edges of the board, on each side, and to utilize that information in the next step 704 to compare the result to a predetermined selection criteria to qualify the board.

More particularly, the present invention can be described as a method of qualifying the accuracy of a printed circuit board by providing a printing mask pattern for a first side of the printed circuit board with a first sequence of a spaced indicia parallel to a first edge of the board; and a second sequence of spaced indicia parallel to a second edge of the board opposite said first edge. A layer of visually conspicuous material (such as the metallization pattern) is then printed on the printed circuit board using said mask pattern. The individual boards are then cut or routed from the panel on which they were printed, and the quality inspection process according to the present invention can be commenced. A human operator can visually inspect the board and determine if the board has been accurately routed by examining the right triangles printed on the first and second edges respectively of the board. This data can then be compared against a qualification criteria to accept or reject the board.

It will be understood that each of the elements described above, or two or more together, also may find a useful application in other types of constructions differing from the types described above.

While the invention has been illustrated and described as embodied in a quality control method for printed circuit boards, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

The invention claimed is:

1. A method of qualifying the accuracy of a printed circuit board comprising:
   providing a printing mask pattern for a first side of the printed circuit board with a first spaced indicia including a right triangle with its base parallel and adjacent to a first edge of the board; and a second spaced indicia including a right triangle with its base parallel and adjacent to a second edge of the board opposite said first edge;
   printing a layer of visually conspicuous material on a printed circuit board using said mask pattern;
   determining the position of the apex of one indicia with respect to a corresponding alignment mark on the printed circuit board; and
   based upon such position against a qualification criteria, accepting or rejecting the board.

2. A method as defined in claim 1, wherein a plurality of boards are implemented on a panel and further comprising separating the board from the panel prior to the determining step.

3. A method as defined in claim 1, wherein the method of separating includes routing.

4. A method as defined in claim 1, wherein the determining step is performed by visual inspection of the first and second sides of the board by an operator.

5. A method of qualifying the accuracy of a printed circuit board comprising:
   printing first and second visually conspicuous symbols on a circuit board while the circuit board is part of a panel with the first symbol including an angled measuring side, the second symbol being positioned in closer proximity to a longitudinal centerline of the circuit board than the first symbol;
   removing the circuit board from the panel and forming a longitudinal edge that is parallel with the longitudinal centerline and intersects the first symbol along the measuring side with the measuring side forming an acute angle with the longitudinal edge, the circuit board also including a first end that is perpendicular with the longitudinal centerline;
   accepting the circuit board when a line parallel with the first end and extending through a point where the longitudinal edge and the measuring side intersect also extends through the second symbol.

6. The method of claim 5, wherein printing the first symbol includes printing a right triangle and printing the second symbol includes printing a rectangle.

7. The method of claim 5, further comprising positioning a printing mask over the circuit board and printing the first and second symbols on the circuit board.

8. The method of claim 5, further comprising printing third and fourth visually conspicuous symbols on the circuit board while the circuit board is part of the panel, the third and fourth symbols being on an opposite side of the longitudinal centerline from the first and second symbols.

9. The method of claim 8, further comprising printing the symbols such that the first and third symbols are substantially identical and the second and fourth symbols are substantially identical.

10. The method of claim 5, further comprising forming a pattern of electrical contact points at the first end of the circuit board and the first and second symbols using a metal layer.

11. A method of qualifying the accuracy of a printed circuit board comprising:
   placing a mask with a mask pattern over a circuit board while the circuit board is part of a panel;
   printing first and second visually conspicuous symbols on the circuit board using the mask with the first symbol including a right triangle that includes a hypotenuse;
   removing the circuit board from the panel with the circuit board including a longitudinal edge and a perpendicular first end, the longitudinal edge forming an edge of the first symbol;

accepting the circuit board when a line parallel with the first end and extending through a point where the longitudinal edge meets the hypotenuse also extends through the second symbol.

12. The method of claim 11, further comprising positioning the first and second symbols with the second symbol being in closer proximity to a longitudinal centerline of the circuit board than the first symbol.

13. The method of claim 11, wherein the second symbol includes a rectangle with a pair of long sides and a pair of short sides with the long sides being parallel with the first end.

14. The method of claim 11, wherein removing the circuit board from the panel includes cutting the circuit board from the panel.

15. The method of claim 11, further comprising reducing a size of the first symbol by removing the first symbol from the panel.

16. The method of claim 11, further comprising forming the symbols with the first symbol including a greater height measured along an axis perpendicular to the first end than the second symbol.

* * * * *